(12) United States Patent
Lee et al.

(10) Patent No.: US 6,280,579 B1
(45) Date of Patent: *Aug. 28, 2001

(54) TARGET MISALIGNMENT DETECTOR (75) Inventors: Seh Kwang Lee, Koyang (KR); John Egermeier, San Jose, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/123,507

(22) Filed: Jul. 28, 1998

Related U.S. Application Data (63) Continuation-in-part of application No. 08/994,318, filed on Dec. 19, 1997, now abandoned.

(51) Int. Cl.⁷ .................................................. C23C 14/34

(52) U.S. Cl. ................ 204/192.13; 209/192.12; 209/192.15; 209/298.03; 209/298.08; 209/298.12

(58) Field of Search ................. 204/192.13, 298.03, 204/192.12, 298.08, 192.15, 298.12

(56) References Cited

U.S. PATENT DOCUMENTS

| 4,166,783 | * | 9/1979 | Turner | 204/192.13 |
| 4,166,784 | * | 9/1979 | Chapin et al. | 204/192.13 |
| 4,336,118 |   | 6/1982 | Patten et al. | 204/192.3 |

(List continued on next page.)

FOREIGN PATENT DOCUMENTS

| 0520519 | 12/1992 | (EP) . |
| 2162365 | 1/1986 | (GB) . |
| 2231197 | 11/1990 | (GB) . |
| 61190070 | 8/1986 | (JP) . |
| 6232055 | 8/1994 | (JP) . |
| 6283470 | 10/1994 | (JP) . |
| 7176398 | 7/1995 | (JP) . |
| 7176399 | 7/1995 | (JP) . |
| 8153712 | 6/1996 | (JP) . |
| 82888259 | 11/1996 | (JP) . |
| WO860623 | 11/1986 | (WO) . |

OTHER PUBLICATIONS

M. Yamashita, "Sputter Type High Frequency Ion Source for Ion Beam Deposition Apparatus," Jap. J. Appl. Phys., vol. 26, pp. 721–727, 1987.

M. Yamashita, "Fundamental Characteristics of Built–in High Frequency Coil Type Sputtering Apparatus," J. Vac. Sci. Technol., vol. A7, pp.151–158,1989.

S.M. Rossnagel et al., "Metal Ion Deposition from Ionized Magnetron Sputtering Discharge," J. Vac. Sci. Technol., vol. B12, pp. 449–453, 1994.

S.M. Rossnagel et al., "Magnetron Sputter Deposition with High Levels of Metal Ionization," Appl. Phys. Lett., vol. 63, pp.3285–3287, 1993.

(List continued on next page.)

*Primary Examiner*—Nam Nguyen
*Assistant Examiner*—Julian A. Mercado
(74) *Attorney, Agent, or Firm*—Konrad, Raynes & Victor (57) ABSTRACT

A method and apparatus for detecting target misalignment and plasma instability in a sputtering chamber in a semiconductor fabrication system is provided. In certain embodiments, a detector is utilized to monitor the voltage of the power applied to bias the target. If the voltage fluctuates excessively, plasma instability and target misalignment is indicated.

43 Claims, 4 Drawing Sheets

U.S. PATENT DOCUMENTS

| | | | |
|---|---|---|---|
| 4,362,632 | | 12/1982 | Jacob ............................... 118/723 R |
| 4,409,087 | * | 10/1983 | Quick ............................. 204/192.13 |
| 4,626,312 | | 12/1986 | Tracy .............................. 204/298.34 |
| 4,661,228 | | 4/1987 | Mintz .............................. 204/298.18 |
| 4,716,491 | | 12/1987 | Ohno et al. ..................... 204/192.34 |
| 4,792,732 | | 12/1988 | O'Loughlin ..................... 315/111.41 |
| 4,842,703 | | 6/1989 | Class et al. .......................... 156/345 |
| 4,844,775 | | 7/1989 | Keeble ................................ 118/50.1 |
| 4,865,712 | | 9/1989 | Mintz .............................. 204/192.12 |
| 4,871,421 | | 10/1989 | Ogle et al. .......................... 156/345 |
| 4,918,031 | | 4/1990 | Flamm et al. .................. 204/192.25 |
| 4,925,542 | | 5/1990 | Kidd ..................................... 315/334 |
| 4,941,915 | | 7/1990 | Matsuoka et al. ............. 204/192.11 |
| 4,948,458 | | 8/1990 | Ogle .................................... 118/50.1 |
| 4,963,238 | * | 10/1990 | Siefkes et al. .................. 204/192.12 |
| 4,983,269 | * | 1/1991 | Wegmann ....................... 204/192.13 |
| 4,990,229 | | 2/1991 | Campbell et al. ............. 204/298.06 |
| 4,999,096 | | 3/1991 | Nihei et al. ..................... 204/192.15 |
| 5,065,698 | | 11/1991 | Koike ................................... 118/719 |
| 5,091,049 | | 2/1992 | Campbell et al. .................... 427/531 |
| 5,122,251 | | 6/1992 | Campbell et al. ..................... 216/37 |
| 5,135,629 | | 8/1992 | Sawada et al. .................. 204/192.12 |
| 5,146,137 | | 9/1992 | Gesche et al. .................. 315/111.21 |
| 5,175,608 | | 12/1992 | Nihei et al. .......................... 257/751 |
| 5,178,739 | | 1/1993 | Barnes et al. ........................ 204/298 |
| 5,192,894 | * | 3/1993 | Teschner ......................... 313/111.21 |
| 5,206,516 | | 4/1993 | Keller at al. ...................... 250/492.2 |
| 5,225,740 | | 7/1993 | Ohkawa .......................... 204/298.37 |
| 5,231,334 | | 7/1993 | Paranjpe .............................. 156/345 |
| 5,234,560 | | 8/1993 | Kadlec et al. ................... 204/298.18 |
| 5,241,245 | | 8/1993 | Barnes et al. ................... 315/111.81 |
| 5,280,154 | | 1/1994 | Cuomo et al. ....................... 156/345 |
| 5,304,279 | | 4/1994 | Coultas et al. ....................... 156/345 |
| 5,312,717 | | 5/1994 | Sachdev et al. ...................... 430/313 |
| 5,346,578 | | 9/1994 | Benzing et al. ..................... 156/345 |
| 5,361,016 | | 11/1994 | Ohkawa et al. ................. 315/111.41 |
| 5,366,590 | | 11/1994 | Kadomura ............................ 438/723 |
| 5,368,685 | | 11/1994 | Kumihashi et al. ................. 156/345 |
| 5,397,962 | | 3/1995 | Moslehi .......................... 315/111.51 |
| 5,404,079 | | 4/1995 | Ohkuni et al. .................. 204/192.12 |
| 5,418,431 | | 5/1995 | Williamson et al. ......... 118/723 AN |
| 5,421,891 | | 6/1995 | Campbell et al. ............... 118/723 R |
| 5,429,070 | | 7/1995 | Campbell et al. ............... 118/723 R |
| 5,429,710 | | 7/1995 | Akiba et al. ......................... 438/714 |
| 5,429,995 | | 7/1995 | Nishimaya et al. ................. 438/788 |
| 5,430,355 | | 7/1995 | Paranjpe .......................... 315/111.21 |
| 5,503,676 | | 4/1996 | Shufflebotham et al. ..... 118/723 MR |
| 5,573,595 | | 11/1996 | Dible ................................. 118/723 E |
| 5,589,224 | * | 12/1996 | Tepman et al. .................... 427/248.1 |
| 5,661,669 | * | 8/1997 | Mozumder et al. ............ 204/192.13 |
| 5,707,498 | * | 1/1998 | Ngan ................................ 204/192.12 |
| 5,803,977 | * | 9/1998 | Tepman et al. ....................... 118/728 |
| 5,951,775 | * | 9/1999 | Tepman ................................ 188/729 |

OTHER PUBLICATIONS

S.M. Rossnagel, et al., "Filling Dual Damascene Interconnect Structures with AlCu and Cu Using Ionized Magnetron Deposition," J. Vac. Sci. Technol., vol. B13, pp. 125–129, 1995.

Y–W. Kim et al., "Ionized Sputter Deposition of AlCu: Film Microstructure and Chemistry," J. Vac. Sci. Technol., vol. A12, pp. 3169–3175, 1994.

J. Hopwood et al., "Mechanisms for Highly Ionized Magnetron Sputtering," J. Appl. Phys., vol 78, pp. 758–765, 1995.

P. Kidd, "A Magnetically Confined and ECR Heated Plasma Machine for Coating and Ion Surface Modification Use," J. Vac. Sci. Technol., vol. A9, pp. 466–473, 1991.

W.M. Holber, et al., "Copper Deposition by Electron Cyclotron Resonance Plasma," J. Vac. Sci. Technol., vol A11, pp. 2903–2910, 1993.

S.M. Rossnagel, "Directional and Ionized Sputter Deposition for Microelectronics Applications," Proc. of 3rd ISSP-(Tokyo), pp. 253–260, 1995.

M. Matsuoka et al., Dense Plasma Production and Film Deposition by New High–Rate Sputtering Using an Electric Mirror, J. Vac. Sci. Technol., A 7 (4), 2652–2657, Jul/Aug 1989.

U.S patent application Ser. No. 08/680,335, filed Jul. 10, 1996 (Atty. Dk. 1390–CIP/PVD/DV).

N. Jiwari et al., "Helicon wave plasma reactor employing single–loop antenna," J. of Vac. Sci. Technol., A 12(4), pp. 1322–1327, Jul/Aug 1994.

Search report dated Feb. 27, 1997, EPC application No. 96308251.6

U.S patent application Ser. No. 08/559,345, filed Nov. 15, 1995 (Aty. Dk. 938/PVD/DV).

U.S patent application Ser. No. 08/733, 620, filed Oct. 17, 1996 (Attorney Docket #1457/PVD/DV).

U.S patent applictaion Ser. No. 08/741,708, filed Oct. 31, 1996 (Attorney Docket #1590/PVD/DV).

Declaration of Seh–Kwang Lee with Attachment A (below). Preliminary demo report on the investigation of the cause of the ignition delay; Applied Materials Koea, Technology Center/PVD; Dec. 13, 1996.

* cited by examiner

TARGET MISALIGNMENT DETECTOR

RELATED APPLICATION

This application is a continuation-in-part of U.S. patent application Ser. No. 08/994,318 filed on Dec. 19, 1997, now abandoned.

FIELD OF THE INVENTION

The present invention relates to a method and apparatus for sputtering deposition material onto a substrate in the fabrication of semiconductor devices.

BACKGROUND OF THE INVENTION

Semiconductor devices often have one or more layers of a metal deposited onto the device during the fabrication of the device. These deposited layers may be used to form interconnects to electrically couple various portions of the device. Layers of insulative material may likewise be deposited onto the device during fabrication.

A number of techniques have been developed to deposit layers of material including chemical vapor deposition (CVD) and physical vapor deposition (PVD), the latter often referred to as "sputtering." In a typical sputtering chamber, a target formed of the desired deposition material is positioned in the vicinity of the substrate onto which the target material is to be deposited. A plasma is created adjacent to the target which is typically biased so as to attract the plasma ions to the target. Ions attracted to this target can impact the target with sufficient force to dislodge i.e. "sputter," material from the surface of the target.

Because the target material tends to be sputtered in all directions of the interior of the chamber and not just onto the device substrate, many sputtering chambers have a shield which encircles the chamber space between the target and the workpiece. The shield confines the sputtered material to minimize deposition of sputtered material on the interior walls of the chamber. This shield is typically at electrical ground whereas the target is usually biased (typically negatively biased) to attract the sputtering ions. Hence, it is desirable in such chambers to space the target from the shield to prevent an electrical short between the target and the shield.

On the other hand, the plasma created adjacent to the target can itself provide a conductive path which can short the sides of the target to that portion of the shield adjacent to the sides of the target. To avoid such a plasma induced short, it has been found that the formation of a plasma between the target sides and the adjacent shield may be inhibited by narrowing the space between the target and the shield to not exceed a predetermined maximum, which may be referred to as the "dark space" gap.

Thus, it is appreciated that achieving good alignment between the shield and the target is important in many applications. If the target is installed either too close or too far from the shield, the sputtering chamber may not operate properly. In addition to undesirable arcing between the shield and the target, the quality of the deposition may be adversely affected as well. Such improper alignment may not be detected until after valuable wafers have been ruined and the source of the problem properly traced to target misalignment.

The size of the desired darkspace gap between the target and the shield will vary, depending upon the particular application. In many applications, the maximum desired darkspace is on the order of millimeters. On the other hand, targets are usually quite large and heavy, varying in size from 200–250 mm in diameter or more. Thus, attaining proper alignment during installation of the target can be difficult to achieve. Because the shield is usually even larger in size, a smaller shield, referred to as a "darkspace" shield has been used in combination with the main shield. While use of a separate darkspace shield adjacent to the target has facilitated aligning the target to the shield, consistently achieving proper alignment has continued to be a problem in many applications. Hence, there is a need to reliably detect target misalignment before device production is resumed following installation of the target.

BRIEF SUMMARY OF THE INVENTION

It is an object of the present invention to provide an improved method and apparatus for detecting target misalignment and plasma instability in a sputtering apparatus, which obviate, for practical purposes, the above-mentioned limitations.

These and other objects and advantages are achieved by, in accordance with one aspect of the invention, a method and apparatus which monitors the power applied to bias the target in a sputter apparatus. It has been found by the present inventors that misalignment of the target may be readily detected by monitoring fluctuations in the power applied to the target over one or more intervals. It is believed that such fluctuations are the result of an instability induced in the plasma as a result of the target misalignment. Thus, if the power applied to the target fluctuates excessively, target misalignment is indicated. The amount of fluctuation necessary to indicate a misaligned target may be different for different targets and sputtering conditions.

In certain embodiments, a method of detecting target misalignment in a sputter deposition apparatus includes applying power to bias the target and detecting fluctuations in the power being applied to the target. A target misalignment signal is then provided as a function of the detected power fluctuations.

Other embodiments include an apparatus for sputter depositing material from a target onto a workpiece. The apparatus includes a chamber, a target and a power supply having an output coupled to the target for providing a power signal to bias the target. A detector is coupled to the power supply output for providing a signal indicating target misalignment as a function of the power signal.

DETAILED DESCRIPTION OF EMBODIMENTS

Figure 1:
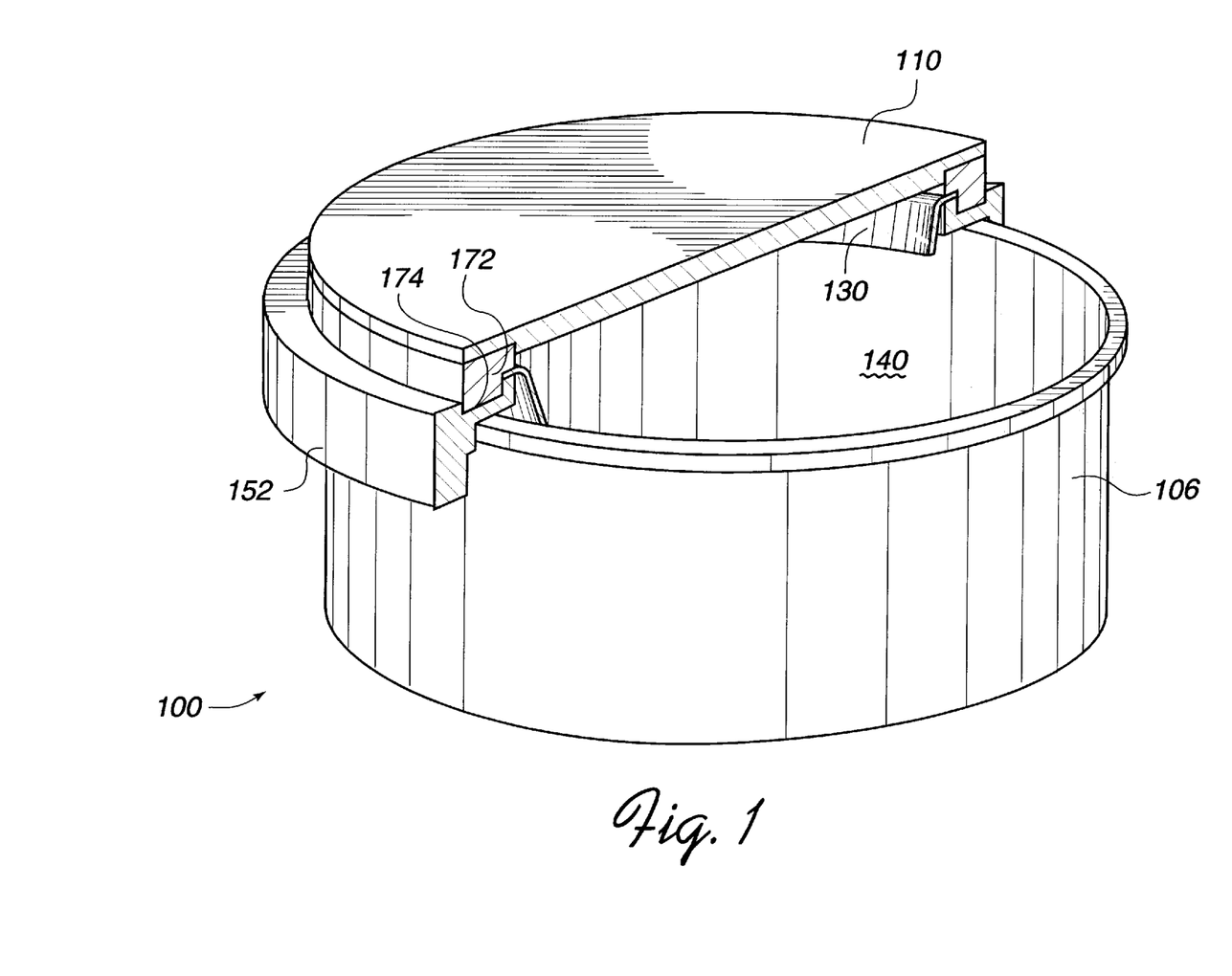
FIG. 1 is a perspective, partial cross-sectional view of an example of a sputter depositing chamber with which the present invention may be used.
Figure 2:
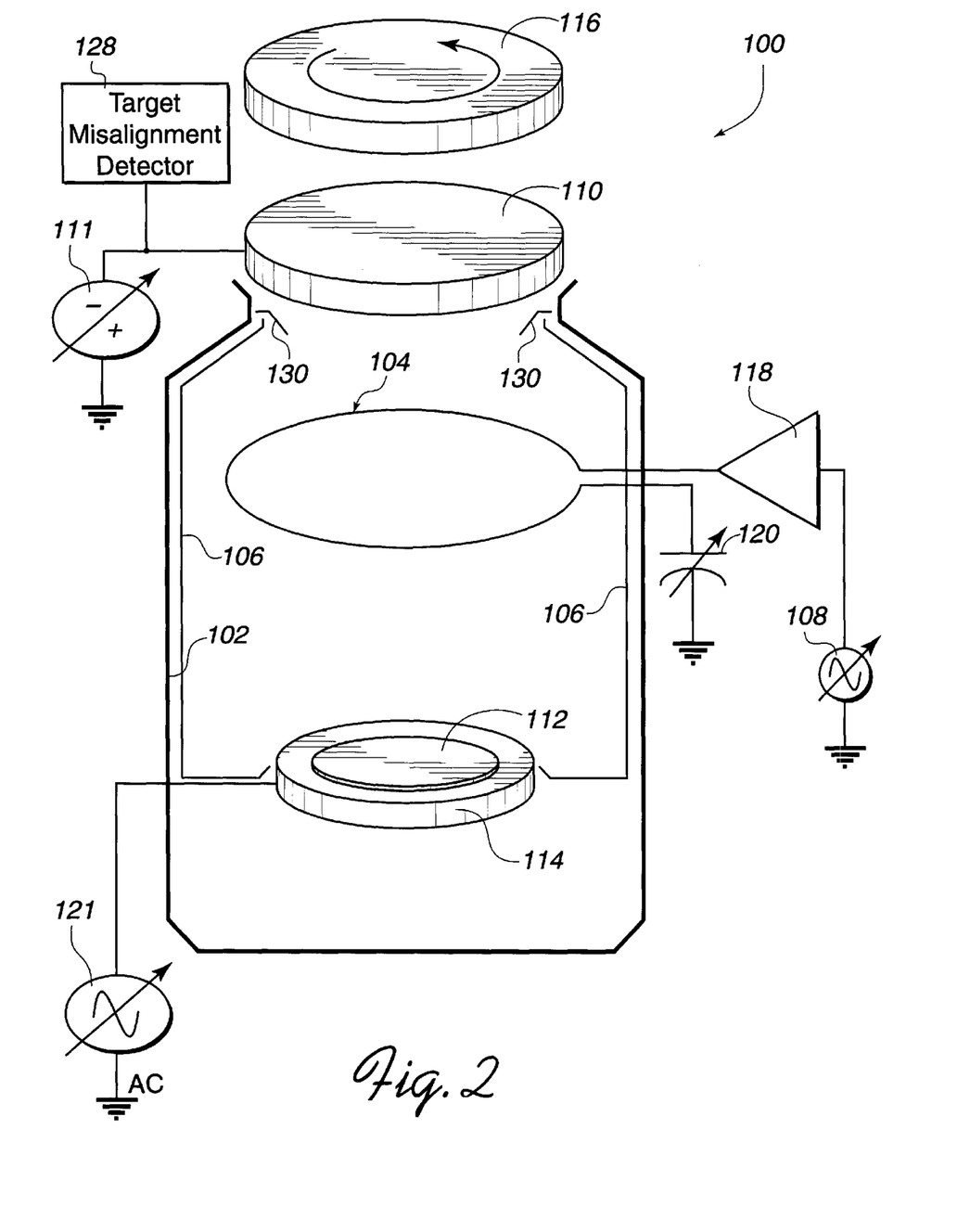
FIG. 2 is a schematic diagram of the sputter chamber of FIG. 1 and a target misalignment detector in accordance with one embodiment of the present invention.

Referring first to FIGS. 1 and 2, one example of a sputter deposition apparatus which may be used with a target misalignment sensor in accordance with a first embodiment of the present invention comprises a substantially cylindrical plasma chamber 100 which is received in a vacuum chamber 102 (shown schematically in FIG. 2). The plasma chamber 100 of this embodiment optionally may have a single turn coil 104 (shown only in FIG. 2) which is carried internally by a shield 106. A multiple turn coil or multiple coils could also be used. The shield 106 protects the interior walls (not shown) of the vacuum chamber 102 from the material being deposited within the interior of the plasma chamber 100.

If the chamber has a coil such as the single turn coil 104 shown in FIG. 2, radio frequency (RF) energy from an RF generator 108 is radiated from the coil 104 into the interior of the deposition system 100, which energizes a plasma within the deposition system 100. The energized plasma of the coil 104 together with a plasma generated by a rotating magnet assembly 116 (often referred to as a magnetron) produce a plasma ion flux which strikes a negatively biased target 110 positioned at the top of the chamber 102. The target 110 is negatively biased by a DC power source 111. The plasma ions eject material from the target 110 onto a substrate 112 which may be a wafer or other workpiece which is supported by a pedestal 114 at the bottom of the deposition system 100. The rotating magnet assembly 116 provided above the target 110 produces magnetic fields which sweep over the face of the target 110 to promote uniform erosion of the target.

A high percentage of the atoms of material ejected from the target 110 are in turn ionized by the plasma being energized by the coil 104 which is inductively coupled to the plasma. The RF generator 108 is preferably coupled to the coil 104 through an amplifier and impedance matching network 118. The other end of the coil 104 is coupled to ground, preferably through a capacitor 120 which may be a variable capacitor. The ionized deposition material is attracted to the substrate 112 and forms a deposition layer thereon. The pedestal 114 may be negatively biased by an AC (or DC or RF) source 121 so as to externally bias the substrate 112. Alternatively, external biasing of the substrate 112 may be eliminated.

As will be explained in greater detail below, in accordance with one aspect of the present invention, a target misalignment detector 128 (FIG. 2) monitors the voltage of the power output by the DC power supply 111 to the target 110 to detect instability in the plasma in the chamber. If the measured voltage fluctuations exceed a certain value, it is deemed that the target 110 is likely not properly aligned in the chamber and is therefore causing the detected plasma instability. In this manner, target misalignment may be quickly detected and remedied. Conversely, if the measured voltage fluctuations remain with the predetermined limits, it is deemed that the target 110 is likely properly aligned in the chamber and the target misalignment signal will indicate accordingly and the process may be permitted to continue in the usual fashion.

As best seen in FIG. 1, the plasma chamber 100 has a dark space shield ring 130 which provides a ground plane with respect to the target 110 above which is negatively biased. The dark space shield is preferably spaced sufficiently close to the target 110 so as to inhibit the formation of plasma between the target and the shield 130 which could permit an electrical short to develop between the shield 130 and the target 110. Hence, precise alignment of the target 110 relative to the shield ring 130 is beneficial in many applications. However, misalignment has heretofore often not been readily detected once production of semiconductor devices has been initiated. It may be detected in some instances only after the machine is subsequently disassembled for cleaning or to replace the target and the visible results of arcing between the target and the shield is noted.

Furthermore, misalignment of the target may reduce the quality of the film being deposited. Once such a film quality degradation has been discovered, and if target misalignment is correctly identified as the source of the problem, the alignment may then be corrected. However, it is of course preferred not to disrupt the production run once it begins. Further, the problem may not be corrected until after expensive wafers may be ruined.

Figure 3:
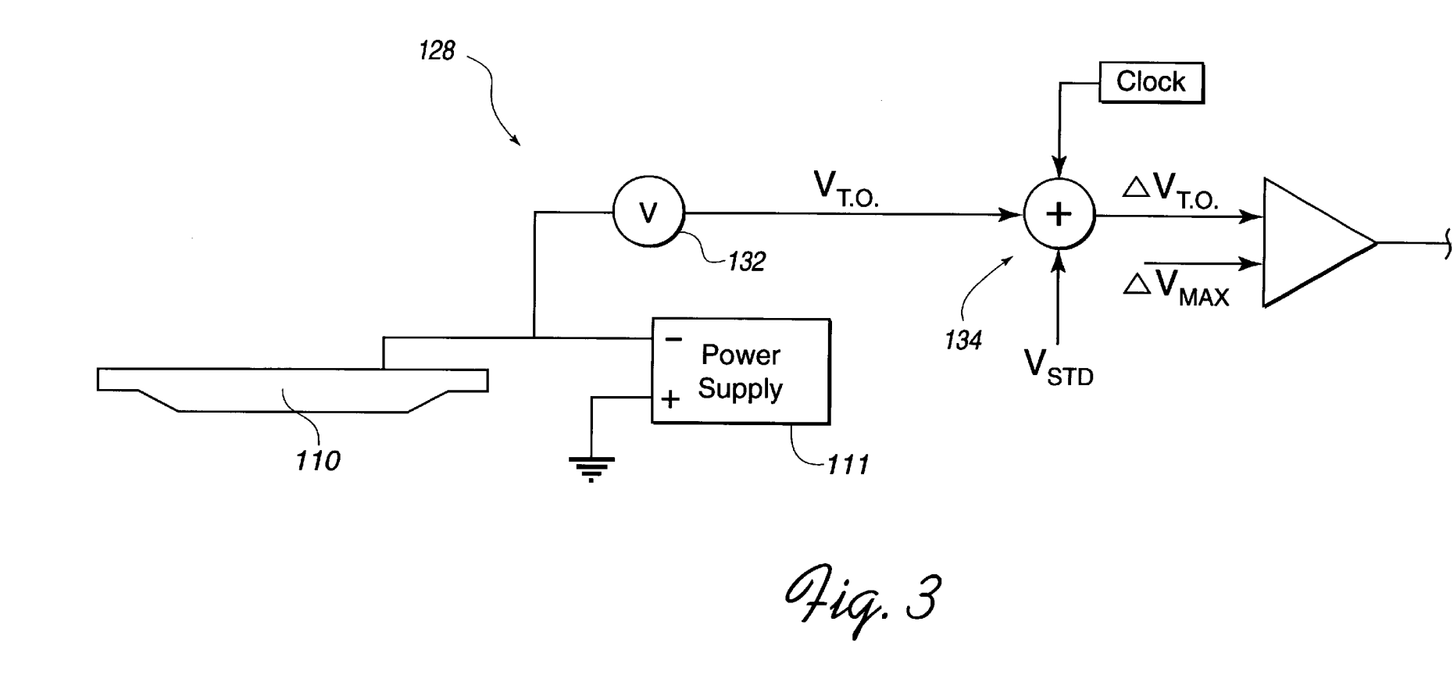
FIG. 3 is a more detailed schematic diagram of the target misalignment detector of FIG. 2 shown with the target of the chamber of FIG. 1.

FIG. 3 is a schematic diagram illustrating one embodiment of a target misalignment detector 128 in accordance with the present invention in greater detail. The detector 128 includes a voltage meter or sensor 132 having an input coupled to the power output of the power supply 111, to monitor any voltage fluctuations of the DC power being supplied to bias the target 110. The sensor 132 provides an output (preferably a digital output) of the sensed output voltage to the target, represented as $V_{T.O.}$ in FIG. 3. A data processor 134 receives the sensed target output voltage $V_{T.O.}$ and detects voltage fluctuations in the sensed voltage.

Figure 4A:
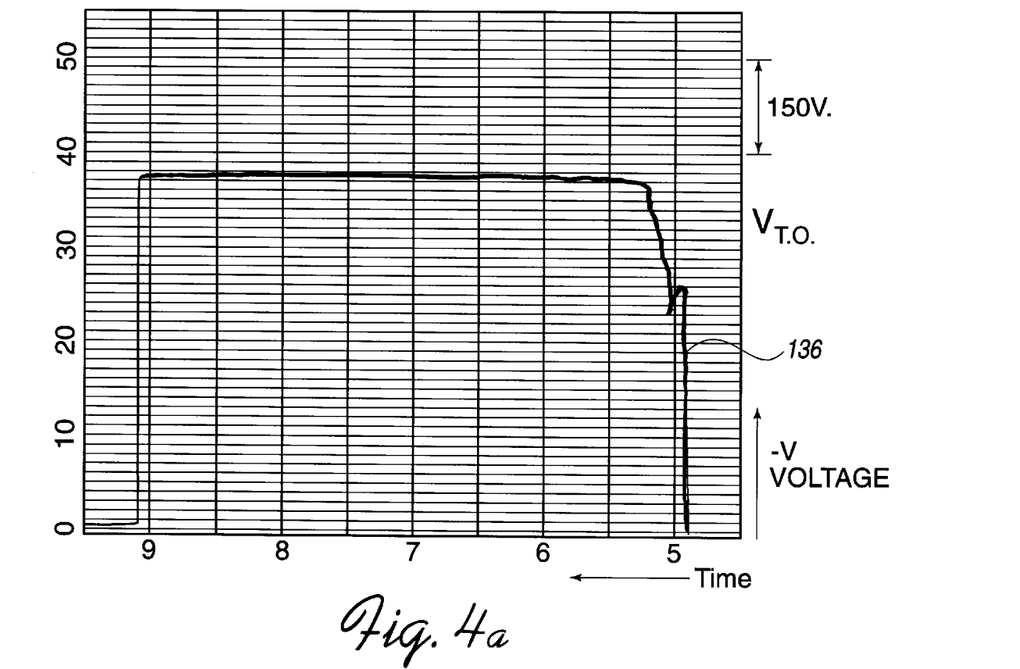
FIG. 4a is a graph depicting target voltage fluctuations as a function of time for an aligned target.
Figure 4B:
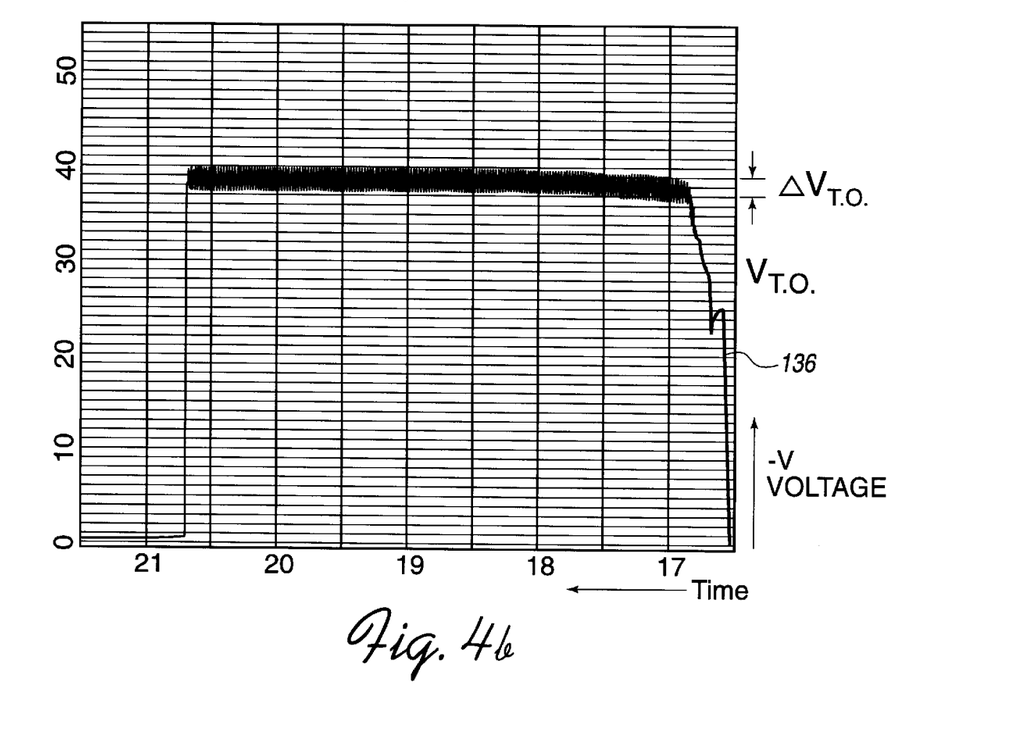
FIG. 4b is a graph depicting target voltage fluctuations as a function of time for a misaligned target.

FIGS. 4a and 4b are graphs of the target output voltage $V_{T.O.}$ versus time while sputtering a titanium target during a pasting step. A pasting step is performed to coat surfaces in a chamber with the target material prior to sputtering the target material onto the workpiece. This may be accomplished by sputtering the titanium target prior to inserting the workpiece into the chamber. When the workpiece is then inserted into the chamber and sputtering is carried out, contamination due to sputtering from surfaces other than the target is minimized because these other surfaces are coated with the target material.

The output voltage illustrated in FIG. 4a is for a properly aligned target and the output voltage of FIG. 4b is for a purposely misaligned target. In FIG. 4a the output voltage $V_{T.O.}$ rises (in the negative voltage direction) rapidly and then reaches a relatively constant voltage of approximately −550 volts. By relatively constant it is meant that the voltage has relatively small fluctuations in amplitude when compared with a misaligned target. It is believed that the target output voltage $V_{T.O.}$ will normally fluctuate due to variations in the plasma during normal operations. If the target is properly aligned relative to the shield ring, then the normal amount of fluctuation will be relatively small. For the aligned Ti target pasting step illustrated in FIG. 4a, the fluctuation in amplitude is approximately 10 volts.

As illustrated in FIG. 4b, the output voltage $V_{T.O.}$ again rises (in the negative voltage direction) rapidly and reaches a voltage of approximately −550 volts. However, once the voltage reaches approximately −550 volts, it fluctuates by a relatively large amplitude as large as approximately 40 volts. It is believed that this fluctuation is the result of instability in the plasma and that the plasma instability is in turn caused by a misalignment of the target. Thus, by detecting the plasma instability or target power fluctuations, target misalignment may also be detected.

The data processor 134 (FIG. 3) can detect such voltage fluctuations in a variety of techniques. For example, the processor 134 can collect voltage measurement data over a predetermined interval, such as one second, for example. During this interval, the processor 134 can identify each relative maximum and each relative minimum of the target output voltage $V_{T.O.}$ during the measurement interval. If the difference between these relative maxima and minima of target output voltage $V_{T.O.}$ exceeds a predetermined maximum difference (such as 20 volts, for example) or a predetermined standard percentage of the output voltage a significant number of times, the processor 134 will indicate that the target is misaligned. Alternatively, the processor 134 can average the relative maxima (or minima) and compare the computed average of the relative maxima to an expected value or to the computed average value of the target output voltage $V_{T.O}$. There are of course many different statistical analyses that may be performed on the target output voltage $V_{T.O}$ to detect excessive plasma fluctuation and hence target misalignment. The processor 134 may be implemented with a programmed workstation or other suitable processor known to those skilled in the art.

The data set forth in Table 1 includes the voltage fluctuation for an aligned target and a misaligned target during sputtering steps including titanium pasting, titanium deposition, titanium nitride deposition and cobalt deposition. In certain processes the titanium pasting, titanium deposition and titanium nitride deposition steps may be carried out as part of a single processing run.

The amount of voltage fluctuation varies for the different sputtering steps, with the titanium pasting step showing the largest fluctuation and the cobalt deposition step showing the smallest fluctuation. In each sputtering step, however, the voltage fluctuation is greater for the misaligned target than for the aligned target.

TABLE 1

Voltage fluctuation for aligned versus misaligned target during titanium, titanium nitride and cobalt sputtering.

| Sputtering Step | Chamber Pressure | Applied Voltage | Voltage Fluctuation aligned | Voltage Fluctuation misaligned |
|---|---|---|---|---|
| Ti pasting | 3.7 mT | 50–570 volts | 10 volts | 40 volts |
| Ti deposition | 5.4 | 510 | 5 | 20 |
| TiN deposition | 3.2–3.3 | 624–635 | 8 | 28 |
| Co deposition | 4.3 | 307 | 0.6 | 1 |

From the data in Table 1 for the titanium pasting step, the aligned target has a voltage fluctuation of roughly 2% of the applied voltage and the purposely misaligned target has a voltage fluctuation of roughly 7%. A voltage fluctuation of greater than 2% (such as 3% or higher) would appear to indicate some level of target misalignment. Different targets and sputtering conditions yield significantly different target output voltage fluctuations. For example, the titanium deposition step (in which the target material is sputtered onto the workpiece) has a voltage fluctuation of roughly 1% of the applied voltage for an aligned target and roughly 4% for the purposely misaligned target. The titanium nitride deposition step also has a voltage fluctuation of roughly 1% of the applied voltage for an aligned target and roughly 4% for the purposely misaligned target. The cobalt deposition step has a voltage fluctuation of roughly 0.2% of the applied voltage for an aligned target and roughly 0.3% for the purposely misaligned target. Thus, the percentage of voltage fluctuation varies significantly depending on the target and sputtering conditions.

In the illustrated embodiment, the dark space shield 130 is a closed continuous ring of titanium (where titanium deposition is occurring in the chamber 100) or stainless steel having a generally inverted frusto-conical shape. Alternatively, the shield 130 may have a slot to reduce eddy currents. The dark space shield extends inward toward the center of plasma chamber 100 so as to overlap the coil 104 by a distance of approximately 6 mm (¼inch). It is recognized, of course, that the amount of overlap can be varied depending upon the relative size and placement of the coil and other factors. For example, the overlap may be increased to increase the shielding of the coil 104 from the sputtered material but increasing the overlap could also further shield the target from the plasma which may be undesirable in some applications. In an alternative embodiment, the coil 104 may be placed in a recessed coil chamber (not shown) positioned to further protect the coil and reduce particle deposits on the workpiece.

The chamber shield 106 is generally bowl-shaped and includes a generally cylindrically shaped, vertically oriented wall 140 to which standoffs are attached to insulatively support the coil 104. The shield further has a generally annular-shaped floor wall (not shown) which surrounds the chuck or pedestal 114 which supports the workpiece 112 which has a 200 mm (8") diameter in the illustrated embodiment. A clamp ring (not shown) may be used to clamp the wafer to the chuck 114 and cover the gap between the floor wall of the shield 106 and the chuck 114.

The plasma chamber 100 is supported by an adapter ring assembly 152 which engages the vacuum chamber 102. The chamber shield 106 is grounded to the system ground through the adapter ring assembly 152. The dark space shield 130, like the chamber shield 106, is grounded through the adapter ring assembly 152.

The target 110 is generally disk-shaped and is also supported by the adapter ring assembly 152. However, the target 110 is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the target 152. The insulator ring assembly 172, which may be made of a variety of insulative materials including ceramics, spaces the target 110 from the adapter ring assembly 152 so that the target 110 may be adequately negatively biased. The target, adapter and insulator ring assembly are provided with O-ring sealing surfaces (not shown) to provide a vacuum tight assembly from the vacuum chamber to the target 110.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 100 MHz. An RF power setting of 4.5 kW is preferred but a range of 1.5–5 kW is believed to be satisfactory. In some applications, energy may also be transferred to the plasma by applying AC or DC power to coils and other energy transfer members. A DC power setting for biasing the target 110 of 3 kW is preferred but a range of 2–5 kW and a pedestal bias voltage of −30 volts DC is believed to be satisfactory for many applications.

A variety of precursor gases may be utilized to generate the plasma including Ar, $H_2$ or reactive gases such as $NF_3$, $CF_4$ and many others. Various precursor gas pressures are suitable including pressures of 0.1–50 mtorr. For ionized PVD, a pressure between 10 and 100 mTorr is preferred for best ionization of sputtered material.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A method of detecting target misalignment in a sputter deposition apparatus, comprising:
applying power to bias said target;
detecting fluctuations in said power being applied to said target; and
providing a target misalignment indication signal as a function of said detected power fluctuations.

2. The method of claim 1, wherein said providing comprises measuring the fluctuation in output voltage over a period of time and determining if said fluctuation in output voltage over said period of time exceeds a predetermined amount.

3. The method of claim 2, wherein said predetermined amount is greater than 2% of said output voltage.

4. The method of claim 3, wherein said target comprises titanium.

5. The method of claim 4, further comprising performing a titanium pasting step.

6. The method of claim 5, further comprising depositing a layer including titanium onto a workpiece.

7. The method of claim 6, further comprising forming a layer of titanium nitride onto a workpiece.

8. The method of claim 7, further comprising measuring said fluctuation in output voltage over a period of time during titanium pasting, during deposition of a layer of titanium on a workpiece, and during the formation of a layer of titanium nitride on said workpiece.

9. The method of claim 2, wherein said predetermined amount is greater than 1% of said output voltage.

10. The method of claim 9, wherein said target comprises titanium.

11. The method of claim 10, further comprising depositing a layer including titanium onto a workpiece.

12. The method of claim 10, further comprising forming a titanium nitride layer on a workpiece.

13. The method of claim 2, wherein said predetermined amount is greater than 0.2% of said output voltage.

14. The method of claim 13, wherein said target comprises cobalt.

15. A method as in claim 1, further comprising aligning said target in response to said misalignment signal.

16. A method of detecting target misalignment in a sputter deposition apparatus, comprising:
applying DC power to bias said target;
detecting voltage fluctuations in said DC power being applied to said target; and
providing a target misalignment indication signal as a function of said detected voltage fluctuations.

17. The method of claim 16 wherein said providing comprises comparing measured output voltages to said target to a standard output voltage and providing said misalignment indication signal if measured output voltages deviate from a predetermined standard by 3% or more.

18. The method of claim 17 wherein said misalignment indication signal is provided if measured output voltages deviate from said standard by 5% or more.

19. The method of claim 17 wherein said predetermined standard is determined by measuring an average value of said output voltage over a predetermined interval.

20. The method of claim 16 wherein said detecting comprises measuring output voltage changes in said DC power and said providing comprises comparing measured output voltage changes to a predetermined output voltage change and providing said misalignment indication signal if measured output voltage changes exceed said predetermined output voltage change.

21. An apparatus for sputter depositing material from a target onto a workpiece, comprising:
a chamber;
a target supported by said chamber;
a power supply having an output coupled to said target for providing a power signal to bias said target; and
a detector coupled to said power supply output for providing a signal indicating target misalignment as a function of said power signal.

22. The apparatus of claim 21 wherein said detector comprises a sensor for sensing power signal fluctuations and a comparator for comparing said sensed power signal fluctuations to a predetermined standard, said target misalignment signal being provided when said sensed power signal fluctuations exceed said predetermined standard.

23. The apparatus of claim 22 wherein said sensor comprises a voltage sensor for measuring output voltages in said power signal.

24. The apparatus of claim 23 wherein said comparator compares measured output voltages to a standard output voltage and said detector provider said misalignment indication signal if measured output voltages deviate from said standard by a predetermined amount.

25. The apparatus of claim 24 wherein said predetermined amount is 3% or more.

26. The apparatus of claim 24 wherein said predetermined amount is 5% or more.

27. The apparatus of claim 24 wherein said standard output voltage is determined by measuring an average value of said output voltage over a predetermined interval.

28. An apparatus for sputter depositing material from a target onto a workpiece, comprising:
a chamber;
a target supported by said chamber and having a surface which comprises a material adapted to be sputtered;
a power supply having an output coupled to said target for providing a power signal to bias said target; and
detector means coupled to said power supply output for providing a signal indicating target misalignment as a function of said power signal.

29. The apparatus of claim 28 wherein said detector means comprises measuring means for measuring voltage fluctuations in said power signal and comparison means for comparing said measured voltage fluctuations to a predetermined standard and for providing said signal indicating target misalignment when said measured voltage fluctuations exceed said predetermined standard.

30. An apparatus for sputtering a layer of material onto a workpiece, comprising:
a chamber;
a target;
a power supply having an output coupled to said target for providing a power signal to bias said target; and
a detector coupled to said power supply output for measuring an amount of signal fluctuation.

31. The apparatus of claim 30, wherein said detector includes a voltage sensor for measuring the fluctuation in output voltage in said power signal.

32. The apparatus of claim 30, further comprising a comparator to compare said signal fluctuation with a predetermined amount of signal fluctuation.

33. The apparatus of claim 32, wherein said comparator provides a signal of misalignment when said sensed power fluctuations exceed 2% of said output voltage over a period of time.

34. The apparatus of claim 33, wherein said target is titanium.

35. The apparatus of claim 32, wherein said comparator provides a signal of misalignment when said sensed power fluctuations exceed 1% of said output voltage over a period of time.

36. The apparatus of claim 35, wherein said target is titanium.

37. The apparatus of claim 32, wherein said comparator provides a signal of misalignment when said sensed power fluctuations exceed 0.2% of said output voltage over a period of time.

38. The apparatus of claim 37, wherein said target is cobalt.

39. An apparatus as in claim 30, wherein said detector includes a voltage sensor for measuring the amplitude of the output voltage fluctuation over a time period.

40. A method for detecting misalignment of a target body in a sputter deposition chamber, comprising:

applying power to bias said target body;

forming a plasma in said chamber;

detecting fluctuations in said power being applied to said target while maintaining said plasma; and providing a target misalignment signal as a function of said fluctuations.

41. A method as in claim 40, wherein said providing a target misalignment signal comprises measuring the amplitude of the fluctuation in output voltage over a period of time.

42. A method as in claim 41, wherein said providing a target misalignment signal further comprises determining if said amplitude of the fluctuation in output voltage over a period of time exceeds a predetermined amount.

43. A method as in claim 40, further comprising aligning said target in response to said target misalignment signal.

* * * * *